(12) United States Patent
Inatomi et al.

(10) Patent No.: US 9,966,306 B2
(45) Date of Patent: May 8, 2018

(54) CATALYST LAYER FORMING METHOD, CATALYST LAYER FORMING SYSTEM AND RECORDING MEDIUM

(71) Applicant: Tokyo Electron Limited, Tokyo (JP)

(72) Inventors: Yuichiro Inatomi, Nirasaki (JP); Takashi Tanaka, Nirasaki (JP); Nobutaka Mizutani, Nirasaki (JP); Yusuke Saito, Koshi (JP); Kazutoshi Iwai, Nirasaki (JP); Mitsuaki Iwashita, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days. days.

(21) Appl. No.: 15/047,690

(22) Filed: Feb. 19, 2016

(65) Prior Publication Data

US 2016/0247683 A1 Aug. 25, 2016

(30) Foreign Application Priority Data

Feb. 23, 2015 (JP) .................................. 2015-033342

(51) Int. Cl.
*H01L 21/768* (2006.01)
*H01L 21/67* (2006.01)
*C23C 18/18* (2006.01)
*C23C 18/16* (2006.01)
*C25D 7/12* (2006.01)
(Continued)

(52) U.S. Cl.
CPC .... *H01L 21/76874* (2013.01); *C23C 18/1651* (2013.01); *C23C 18/1653* (2013.01); *C23C 18/1696* (2013.01); *C23C 18/1889* (2013.01); *C23C 18/38* (2013.01); *C23C 18/50* (2013.01); *C25D 7/12* (2013.01); *H01L 21/67028* (2013.01); *H01L 21/67051* (2013.01);
(Continued)

(58) Field of Classification Search
CPC ..................... H01L 21/76871; H01L 21/76874
See application file for complete search history.

(56) References Cited

U.S. PATENT DOCUMENTS 4,652,311 A * 3/1987 Gulla ...................... C23C 18/28
106/1.11
2004/0134682 A1* 7/2004 En ........................ C23C 18/1607
174/258

(Continued)

FOREIGN PATENT DOCUMENTS

JP 57-016157 A 1/1982
JP 61-102796 A 5/1986
(Continued)

*Primary Examiner* — Mohammad Choudhry
(74) *Attorney, Agent, or Firm* — Pearne & Gordon LLP

(57) ABSTRACT

A catalyst adsorbed on a surface of a substrate is bound to the substrate without leaving residues within a recess of the substrate. A catalyst layer forming method includes forming a catalyst layer 22 by supplying a catalyst solution 32 onto a substrate 2 having a recess 2a to adsorb the catalyst 22A onto a surface of the substrate and onto an inner surface of the recess; rinsing the surface of the substrate 2 and an inside of the recess 2a by supplying a rinse liquid; drying the surface of the substrate 2 and the inside of the recess 2a. Further, by supplying a binder solution 34 containing a binder 22B onto the substrate 2, the catalyst 22A on the surface of the substrate 2 is bound to the substrate 2 by the binder 22B.

13 Claims, 7 Drawing Sheets

(51) Int. Cl.
    *C23C 18/38*    (2006.01)
    *C23C 18/50*    (2006.01)
(52) U.S. Cl.
    CPC .. *H01L 21/76843* (2013.01); *H01L 21/76898*
        (2013.01); *H01L 21/76873* (2013.01)

(56) References Cited

U.S. PATENT DOCUMENTS

2011/0247865 A1\* 10/2011 Tsurumi ............... H05K 3/4661
                                                174/255
2012/0328971 A1\* 12/2012 Matsuda ............... H01M 4/881
                                                429/482

FOREIGN PATENT DOCUMENTS

JP      2012-216722 A    11/2012
JP      2013-067856 A     4/2013

\* cited by examiner

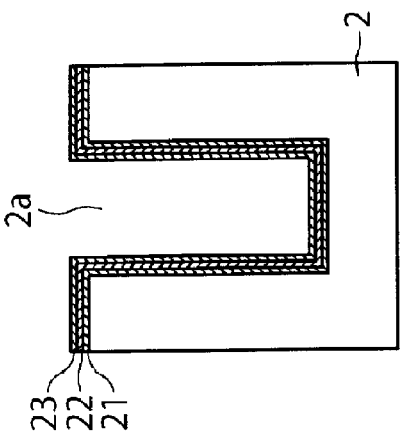
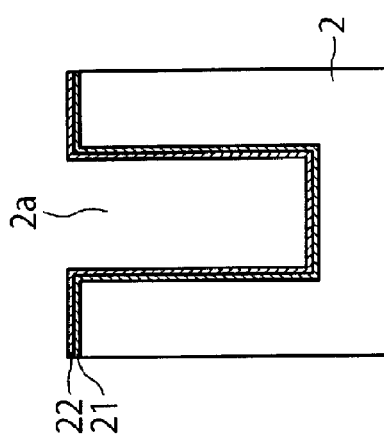
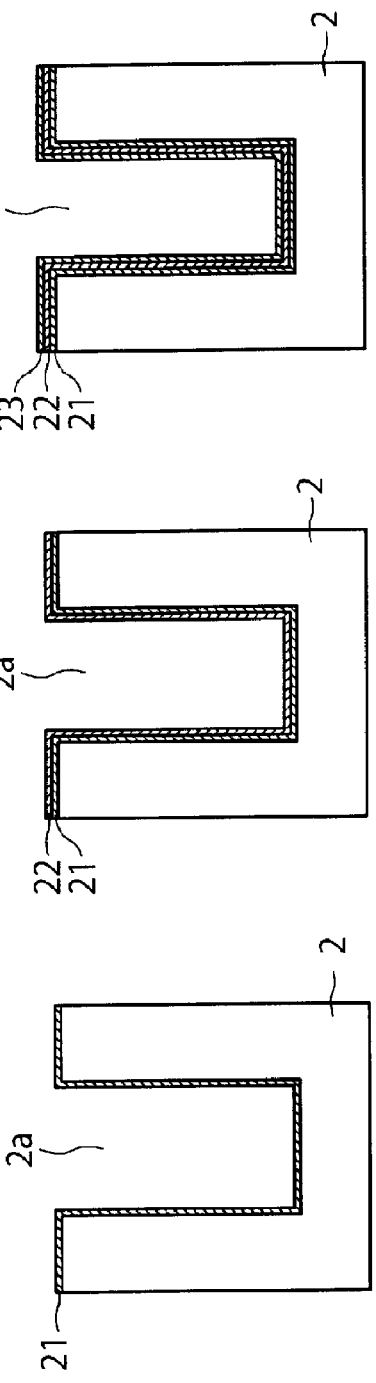
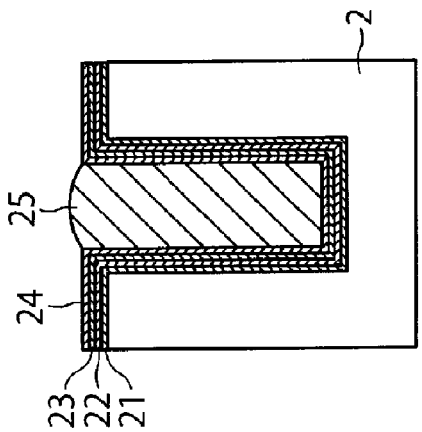
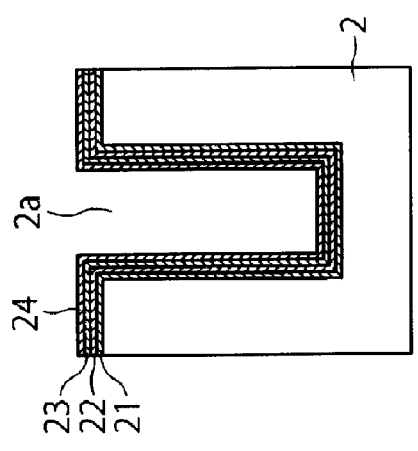

CATALYST LAYER FORMING METHOD, CATALYST LAYER FORMING SYSTEM AND RECORDING MEDIUM

CROSS-REFERENCE TO RELATED APPLICATION

This application claims the benefit of Japanese Patent Application No. 2015-033342 filed on Feb. 23, 2015, the entire disclosures of which are incorporated herein by reference.

TECHNICAL FIELD

The embodiments described herein pertain generally to a catalyst layer forming method and a catalyst layer forming system of forming a catalyst layer on a substrate, and a recording medium therefor.

BACKGROUND

Recently, semiconductor devices such as a LSI or the like have been required to have higher density in order to meet requirements for reducing the mounting space or for improving the processing rate. As an example of a technology that achieves the high density, there has been known a multilayer wiring technology of manufacturing a multilayer substrate, such as a three-dimensional LSI or the like, by stacking multiple wiring substrates.

According to the multilayer wiring technology, a through-via-hole, which penetrates the wiring substrate and in which a conductive material such as copper (Cu) is buried, is typically formed in the wiring substrate in order to obtain electrical connection between the wiring substrates. As an example of a technology for forming the through-via-hole in which a conductive material is buried, there has been known an electroless plating method.

As a specific method of producing a wiring substrate, there is known a method in which a substrate having a recess is prepared, a barrier film is formed as a Cu diffusion barrier film within the recess of the substrate, and a seed film is formed on the barrier film by electroless Cu plating. Thereafter, Cu is buried in the recess by electrolytic Cu plating, and the substrate in which the Cu is buried is then thinned by a polishing method such as chemical mechanical polishing. Through this process, a wiring substrate having a through-via-hole in which the Cu is buried is manufactured.

To form the barrier film of the aforementioned wiring substrate, by adsorbing a catalyst onto the substrate in advance, a catalyst layer is formed. Further, by performing a plating process on the catalyst layer, a barrier film formed of Co—W—B layers is obtained. The barrier film is then baked, so that moisture within the barrier film is removed and the bond between metals is strengthened.

Meanwhile, when adsorbing the catalyst onto the substrate, a catalyst solution containing the catalyst is supplied onto the substrate having the recess, and then the catalyst is adsorbed onto a surface of the substrate and into the recess of the substrate. As a result, the catalyst layer is formed. If, however, the catalyst is adsorbed onto the surface of the substrate and into the recess of the substrate by supplying the catalyst solution onto the substrate, adhesivity of the catalyst adsorbed on the surface of the substrate may be insufficient, so that a plating layer formed by a subsequent plating process may be peeled off. Furthermore, if the catalyst solution remains within the recess of the substrate, the residues of the catalyst solution may have adverse effect upon the characteristic of the entire structure of the wiring substrate.

Patent Document 1: Japanese Patent Laid-open Publication No. 2013-067856

SUMMARY

In view of the foregoing, exemplary embodiments provide a catalyst layer forming method, a catalyst layer forming system and a recording medium, capable of adsorbing and binding a catalyst onto a surface of a substrate securely without leaving residues within a recess of the substrate.

In one exemplary embodiment, a catalyst layer forming method of forming a catalyst layer on a substrate includes preparing the substrate having a recess; forming a catalyst layer by supplying a catalyst solution containing a catalyst onto the substrate to adsorb the catalyst onto a surface of the substrate and onto an inner surface of the recess; rinsing the surface of the substrate and an inside of the recess by supplying a rinse liquid onto the substrate; drying the surface of the substrate and the inside of the recess; and binding the catalyst on the surface of the substrate to the surface of the substrate by supplying a binder solution containing a binder onto the substrate.

In another exemplary embodiment, a catalyst layer forming method of forming a catalyst layer on a substrate includes preparing the substrate having a recess; forming a catalyst layer by supplying a catalyst solution containing a catalyst onto the substrate to adsorb the catalyst onto a surface of the substrate and onto an inner surface of the recess; rinsing the surface of the substrate and an inside of the recess by supplying a rinse liquid onto the substrate; and binding the catalyst on the surface of the substrate to the surface of the substrate by supplying a binder solution containing a binder onto the substrate in a state that the rinse liquid is filled within the recess.

In still another exemplary embodiment, a catalyst layer forming system of forming a catalyst layer on a substrate includes a substrate holding/rotating device configured to hold and rotate the substrate having a recess; a catalyst solution supply unit configured to supply a catalyst solution containing a catalyst onto the substrate to form the catalyst layer by adsorbing the catalyst onto a surface of the substrate and onto an inner surface of the recess; a rinse liquid supply unit configured to supply a rinse liquid to rinse the surface of the substrate and an inside of the recess; a substrate drying unit configured to dry the surface of the substrate and the inside of the recess; and a binder solution supply unit configured to supply a binder solution containing a binder onto the substrate to bind the catalyst on the surface of the substrate to the surface of the substrate.

In yet another exemplary embodiment, a catalyst layer forming system of forming a catalyst layer on a substrate includes a substrate holding/rotating device configured to hold and rotate the substrate having a recess; a catalyst solution supply unit configured to supply a catalyst solution containing a catalyst onto the substrate to form the catalyst layer by adsorbing the catalyst onto a surface of the substrate and onto an inner surface of the recess; a rinse liquid supply unit configured to supply a rinse liquid to rinse the surface of the substrate and an inside of the recess; and a binder solution supply unit configured to supply a binder solution containing a binder onto the substrate to bind the catalyst on the surface of the substrate to the surface of the substrate.

In yet another exemplary embodiment, there is provided a computer-readable recording medium having stored thereon computer-executable instructions that, in response to execution, cause a catalyst layer forming system to perform a catalyst layer forming method. Here, the catalyst layer forming method includes preparing the substrate having a recess; forming a catalyst layer by supplying a catalyst solution containing a catalyst onto the substrate to absorb the catalyst onto a surface of the substrate and onto an inner surface of the recess; rinsing the surface of the substrate and an inside of the recess by supplying a rinse liquid onto the substrate; drying the surface of the substrate and the inside of the recess; and binding the catalyst on the surface of the substrate to the surface of the substrate by supplying a binder solution containing a binder onto the substrate.

In yet another exemplary embodiment, there is provided a computer-readable recording medium having stored thereon computer-executable instructions that, in response to execution, cause a catalyst layer forming system to perform a catalyst layer forming method. Here, the catalyst layer forming method includes preparing the substrate having a recess; forming a catalyst layer by supplying a catalyst solution containing a catalyst onto the substrate to absorb the catalyst onto a surface of the substrate and onto an inner surface of the recess; rinsing the surface of the substrate and an inside of the recess by supplying a rinse liquid onto the substrate; and binding the catalyst on the surface of the substrate to the surface of the substrate by supplying a binder solution containing a binder onto the substrate in a state that the rinse liquid is filled within the recess.

According to the exemplary embodiments, the catalyst can be securely adsorbed onto the surface of the substrate, and no residue remains within the recess of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2A to FIG. 2E are diagrams illustrating a substrate on which a plating method is performed;

DETAILED DESCRIPTION

Figure 1:
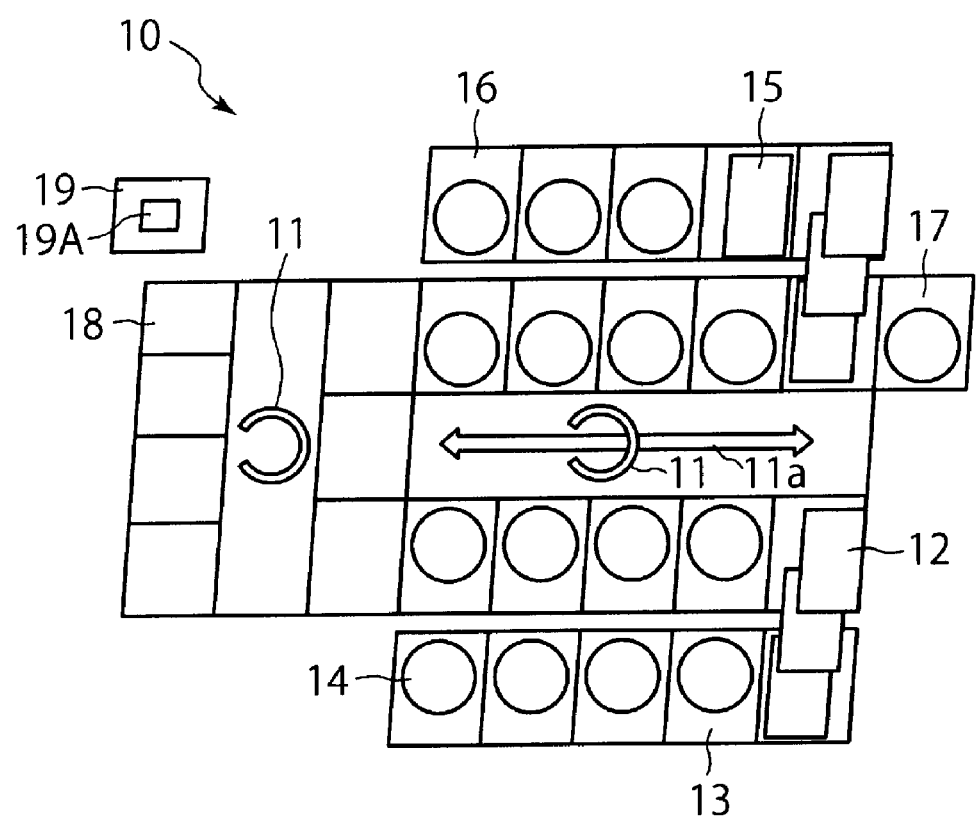
FIG. 1 is a block diagram illustrating an entire plating system equipped with a catalyst layer forming system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

<Plating System>

Referring to FIG. 1 to FIG. 7, an exemplary embodiment will be described.

First, a plating system equipped with a catalyst layer forming system according to the exemplary embodiment will be elaborated with reference to FIG. 1.

As depicted in FIG. 1, the plating system 10 is configured to perform a plating process on a substrate (silicon substrate) 2, such as a semiconductor wafer, having a recess 2a (see FIG. 2A to FIG. 2E).

The plating system 10 includes a cassette station 18 configured to mount thereon a cassette (not shown) which accommodates the substrate 2 therein; a substrate transfer arm 11 configured to take out the substrate 2 from the cassette on the cassette station 18 and transfer the substrate 2; and a moving path 11a along which the substrate transfer arm 11 is moved.

Further, arranged at one side of the moving path 11a are an adhesion layer forming unit 12 configured to form an adhesion layer 21 to be described later by adsorbing a coupling agent such as a silane coupling agent onto the substrate 2; a catalyst layer forming unit 13 configured to form a catalyst layer 22 to be described later by adsorbing a catalyst onto the adhesion layer 21 of the substrate 2; and a plating layer forming unit 14 configured to form a plating layer 23 serving as a Cu diffusion barrier film (barrier film) to be described later on the catalyst layer 22 of the substrate 2.

Further, arranged at the other side of the moving path 11a are a baking unit 15 configured to bake the plating layer 23 formed on the substrate 2; and an electroless Cu plating layer forming unit 16 configured to form an electroless copper (Cu) plating layer 24, serving as a seed film to be described later, on the plating layer 23 formed on the substrate 2.

Further, an electrolytic Cu plating layer forming unit 17 configured to fill the recess 2a of the substrate 2 with an electrolytic copper (Cu) plating layer 25 while using the electroless Cu plating layer 24 as a seed film is provided adjacent to the baking unit 15.

Further, the respective constituent components of the above-described plating system, for example, the cassette station 18, the substrate transfer arm 11, the adhesion layer forming unit 12, the catalyst layer forming unit 13, the plating layer forming unit 14, the baking unit 15, the electroless Cu plating layer forming unit 16 and the electrolytic Cu plating layer forming unit 17 are controlled by a controller 19 according to various types of programs recorded in a recording medium 19A provided in the controller 19, so that various processes are performed on the substrate 2. Here, the recording medium 19A stores thereon various kinds of setup data or various kinds of programs such as a plating processing program to be described later. The recording medium 19A may be implemented by a computer-readable memory such as a ROM or a RAM, or a disk-type recording medium such as a hard disk, a CD-ROM, a DVD-ROM or a flexible disk, as commonly known in the art.

Now, the catalyst layer forming unit 13 configured to form the catalyst layer 22 will be further elaborated. This catalyst layer forming unit 13 constitutes the catalyst layer forming system according to the exemplary embodiment. The catalyst layer forming system may further include the baking unit 15 in addition to the catalyst layer forming unit 13.

Figure 5:
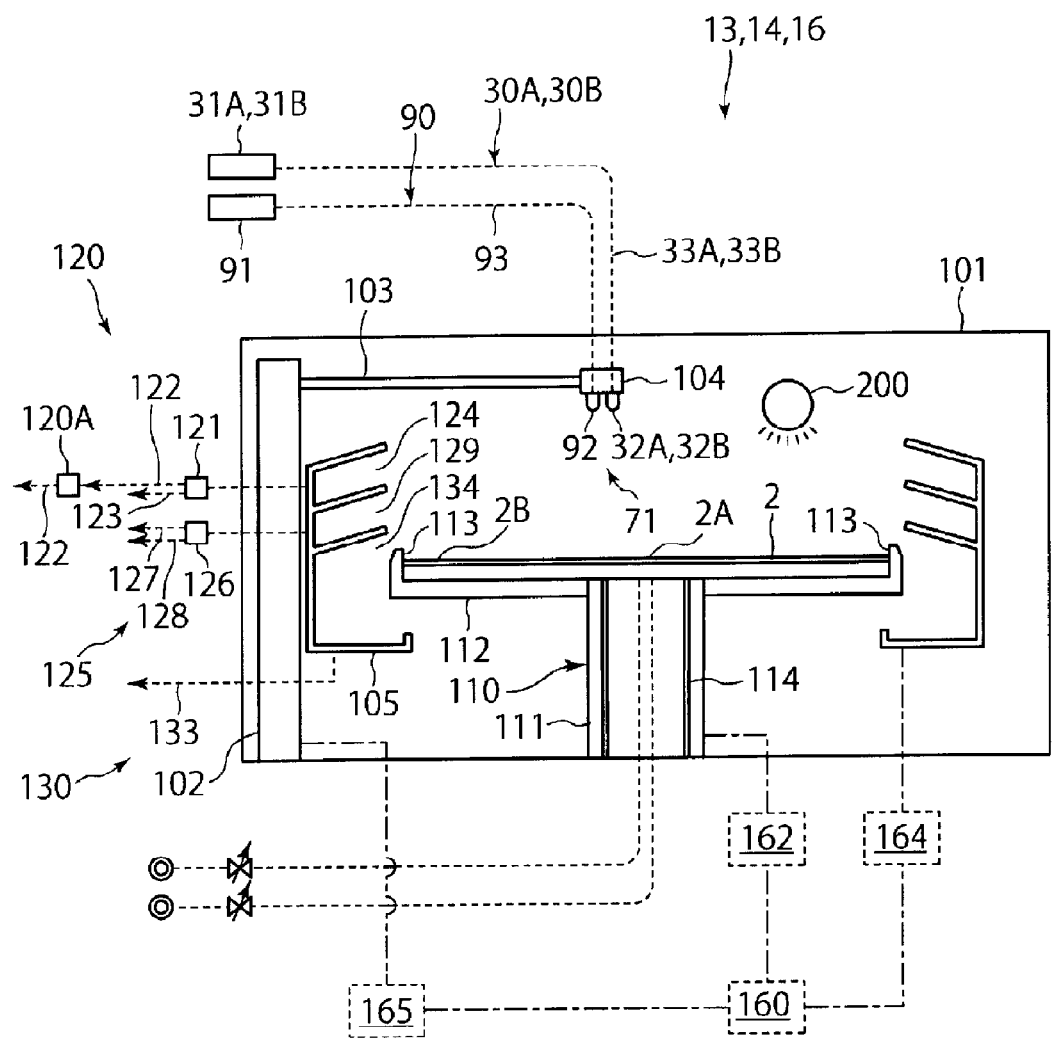
FIG. 5 is a side cross sectional view illustrating a catalyst layer forming system.
Figure 6:
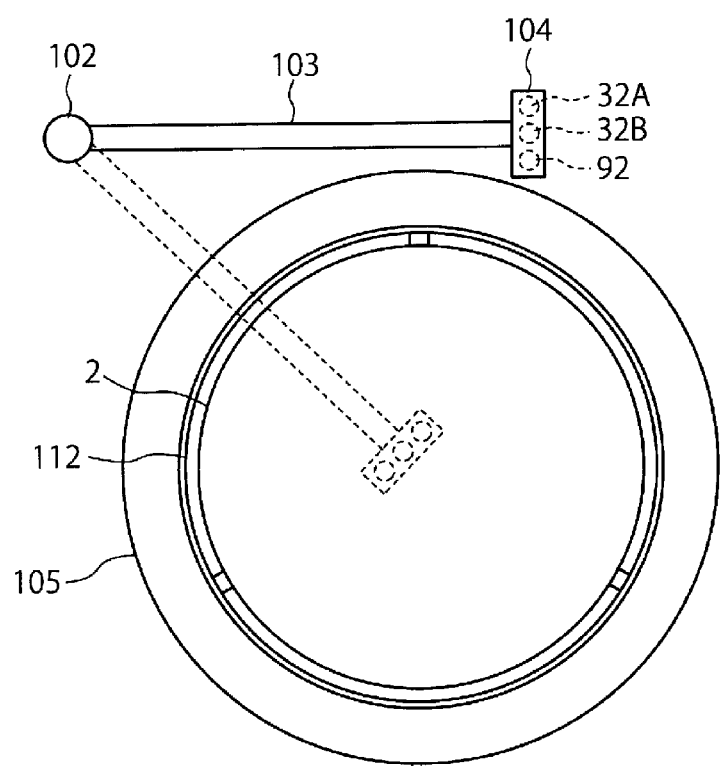
FIG. 6 is a plan view illustrating the catalyst layer forming system.

The catalyst layer forming unit 13 may be implemented by a liquid processing apparatus as illustrated in FIG. 5 and FIG. 6.

Further, each of the plating layer forming unit 14 and the electroless Cu plating layer forming unit 16 may also be implemented by the same liquid processing apparatus as the catalyst layer forming unit 13. The catalyst layer forming unit 13 is illustrated in FIG. 5 and FIG. 6.

The catalyst layer forming unit 13 constituting the catalyst layer forming system includes, as shown in FIG. 5 and FIG. 6, a substrate holding/rotating device (substrate accommodating unit) 110 configured to hold and rotate the substrate 2 within a casing 101; liquid supplying devices 30A, 30B and 90 configured to supply a catalyst solution, a cleaning liquid or the like onto a surface of the substrate 2; a recovery cup 105 configured to collect the catalyst solution, the cleaning liquid or the like dispersed from the substrate 2; draining openings 124, 129 and 134 configured to drain the catalyst solution or the cleaning liquid collected by the recovery cup 105; liquid draining devices 120, 125 and 130 configured to drain the liquids collected in the draining openings; and a controller 160 configured to control the substrate holding/rotating device 110, the liquid supplying devices 30A, 30B and 90, the recovery cup 105 and the liquid draining devices 120, 125 and 130.

(Substrate Holding/Rotating Device)

The substrate holding/rotating device 110 includes, as illustrated in FIG. 5 and FIG. 6, a hollow cylindrical rotation shaft 111 vertically extended within the casing 101; a turntable 112 provided on an upper end portion of the rotation shaft 111; a wafer chuck 113 disposed on a peripheral portion of a top surface of the turntable 112 to support the substrate 2; and a rotating device 162 configured to rotate the rotation shaft 111. The rotating device 162 is controlled by the controller 160, and the rotation shaft 111 is rotated by the rotating device 162. As a result, the substrate 2 supported on the wafer chuck 113 is rotated.

Now, the liquid supplying devices 30A, 30B and 90 configured to supply a catalyst solution, a cleaning liquid, or the like onto the surface of the substrate 2 will be explained with reference to FIG. 5 and FIG. 6. The liquid supplying device 30A is a catalyst solution supplying device (catalyst solution supply unit) configured to supply a catalyst solution onto the surface of the substrate 2. The liquid supplying device 30B is a binder solution supplying device (binder solution supply unit) configured to supply a binder solution to be described later onto the surface of the substrate 2. The liquid supplying device 90 is a cleaning liquid supplying device configured to supply a cleaning liquid onto the surface of the substrate 2.

Further, as depicted in FIG. 5 and FIG. 6, an arm 103 is configured to be moved in a vertical direction, and a nozzle head 104 is provided at a tip end portion of the arm 103. The arm 103 is fastened to a supporting shaft 102 configured to be rotated by a rotating device 165.

Here, the catalyst solution supplying device 30A includes a catalyst solution source 31A, a discharge nozzle 32A provided at the nozzle head 104, and a catalyst solution supply line 33A provided between the catalyst solution source 31A and the discharge nozzle 32A. Further, the binder supplying device 30B includes a binder solution source 31B, a discharge nozzle 32B provided at the nozzle head 104, and a binder solution supply line 33B provided between the binder solution source 31B and the discharge nozzle 32B.

The cleaning liquid supplying device 90 is configured to perform a rinse process on the substrate 2 as will be described later. As illustrated in FIG. 5, the cleaning liquid supplying device 90 includes a nozzle 92 provided at the nozzle head 104, and a pure water/IPA supply line 93 provided between a pure water/IPA source 91 and the nozzle 92. In this configuration, either pure water or IPA can be selectively supplied onto the surface of the substrate 2 from the pure water/IPA source 91 via the nozzle 92.

(Liquid Draining Device)

Now, the liquid draining devices 120, 125 and 130 configured to drain out the catalyst solution, the binder solution, or the cleaning liquid dispersed from the substrate 2 will be elaborated with reference to FIG. 5. As shown in FIG. 5, the recovery cup 105, which can be moved up and down by an elevating device 164 and has the draining openings 124, 129 and 134, is disposed within the casing 101. The liquid draining devices 120, 125 and 130 are configured to drain out the liquids collected in the draining openings 124, 129 and 134, respectively.

As depicted in FIG. 5, the liquid draining devices 120 and 125 include collecting flow paths 122 and 127 and waste flow paths 123 and 128, which are switchably connected by flow path switching devices 121 and 126, respectively. Here, the catalyst solution and the binder solution are collected and reused through the collecting flow paths 122 and 127, respectively, and the catalyst solution and the binder solution are drained out through the waste flow paths 123 and 128, respectively. Further, as shown in FIG. 5, the liquid draining device 130 is only equipped with a waste flow path 133.

Further, as depicted in FIG. 5, the collecting flow path 122 of the liquid draining device 120 configured to drain the catalyst solution is connected to an outlet side of the substrate accommodating unit 110, and a cooling buffer 120A configured to cool the catalyst solution is provided at a portion of the collecting flow path 122 in the vicinity of the outlet side of the substrate accommodating unit 110.

Now, the baking unit 15 will be elaborated.

Figure 7:
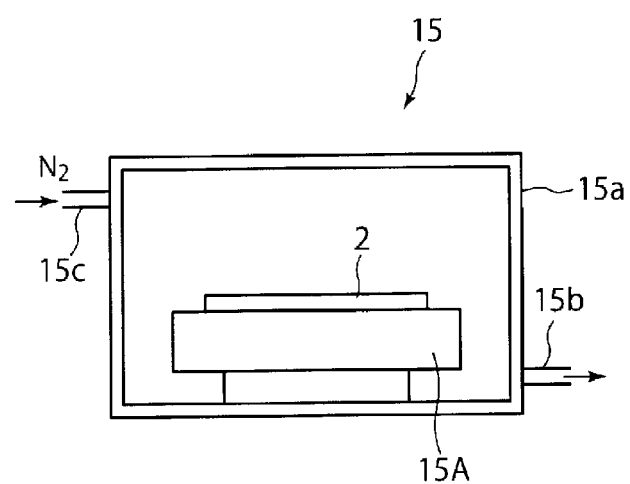
FIG. 7 is a side cross sectional view illustrating a baking unit.

The baking unit 15 includes, as illustrated in FIG. 7, an airtightly sealed casing 15*a*; and a hot plate 15A provided within the airtightly sealed casing 15*a*.

The airtightly sealed casing 15*a* of the baking unit 15 is provided with a transfer opening (not shown) through which the substrate 2 is transferred. An $N_2$ gas is supplied into the airtightly sealed casing 15*a* through an $N_2$ gas supply opening 15*c*.

Further, by evacuating the inside of the airtightly sealed casing 15*a* through an exhaust opening 15*b* and filling the inside of the airtightly sealed casing 15*a* with the $N_2$ gas, the inside of the airtightly sealed casing 15*a* can be maintained under an inert gas atmosphere.

<Plating Method>

Operations according to the exemplary embodiment having the above-described configuration will be explained with reference to FIG. 2 to FIG. 4B.

First, in a pre-process, a recess 2*a* is formed on a substrate (silicon substrate) 2 such as a semiconductor wafer or the like. The substrate 2 having thereon the recess 2*a* is then transferred into the plating system 10 according to the exemplary embodiment.

Within the adhesion layer forming unit 12 of the plating system 10, an adhesion layer 21 is formed on the substrate 2 having the recess 2*a* (see FIG. 2A).

Here, as a method of forming the recess 2*a* on the substrate 2, a commonly known method in the art may be appropriately employed. Specifically, as a dry etching technique, for example, a general-purpose technique using a fluorine-based gas or a chlorine-based gas may be employed. Especially, in order to form a hole having a high aspect ratio (hole depth/hole diameter), a method using an ICP-RIE (Inductively Coupled Plasma Reactive Ion Etching) technique, which can perform a deep etching process with a high speed, may be more appropriately adopted. Especially, a Bosch process in which an etching process using sulfur hexafluoride ($SF_6$) and a protection process using a Teflon-based gas such as $C_4F_8$ are repeatedly performed may be appropriately utilized.

Further, the adhesion layer forming unit 12 has a decompression chamber (not shown) equipped with a heating unit. Within the adhesion layer forming unit 12, a coupling agent such as a silane coupling agent is adsorbed onto the substrate 2 having the recess 2*a*, so that the adhesion layer 21 is formed on the substrate 2 (SAM process). The adhesion layer 21 formed by adsorbing the silane coupling agent is configured to improve adhesivity between the substrate 2 and a catalyst layer 22 to be described later.

The substrate 2, on which the adhesion layer 21 is formed in the adhesion layer forming unit 12, is then transferred by the substrate transfer arm 11 into the catalyst layer forming unit 13 illustrated in FIG. 5 and FIG. 6. In the catalyst layer forming unit 13, nano-palladium (n-Pd) serving as a catalyst is adsorbed on the adhesion layer 21 of the substrate 2, so that the catalyst layer 22 is formed (see FIG. 2B).

Figure 3:
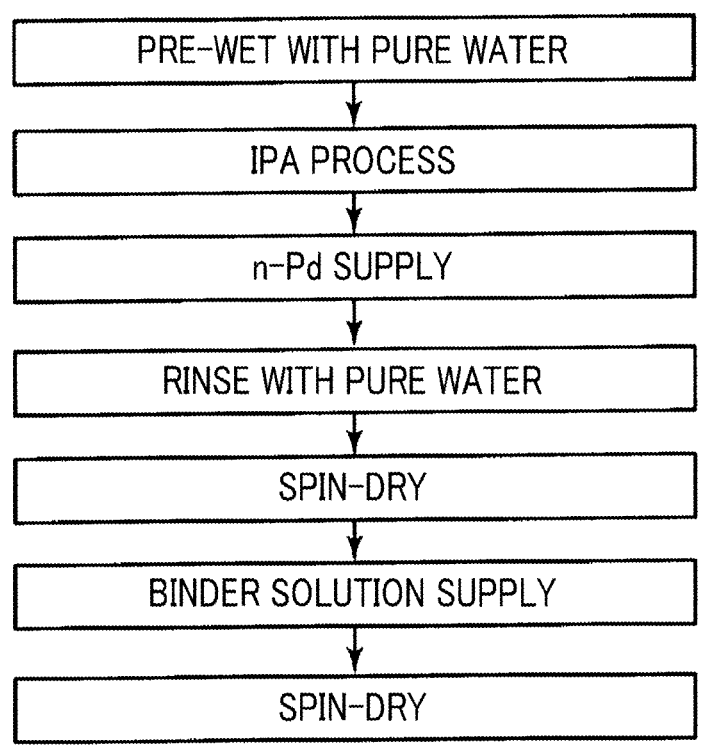
FIG. 3 is a flowchart for describing a catalyst layer forming method according to an exemplary embodiment.

Now, the catalyst layer forming process in the catalyst layer forming unit 13 according to the exemplary embodiment will be further explained with reference to FIG. 3, FIG. 4A, and FIG. 4B.

First, the substrate 2 is placed on the substrate holding/rotating device 110 of the catalyst layer forming unit 13.

Figure 4A:
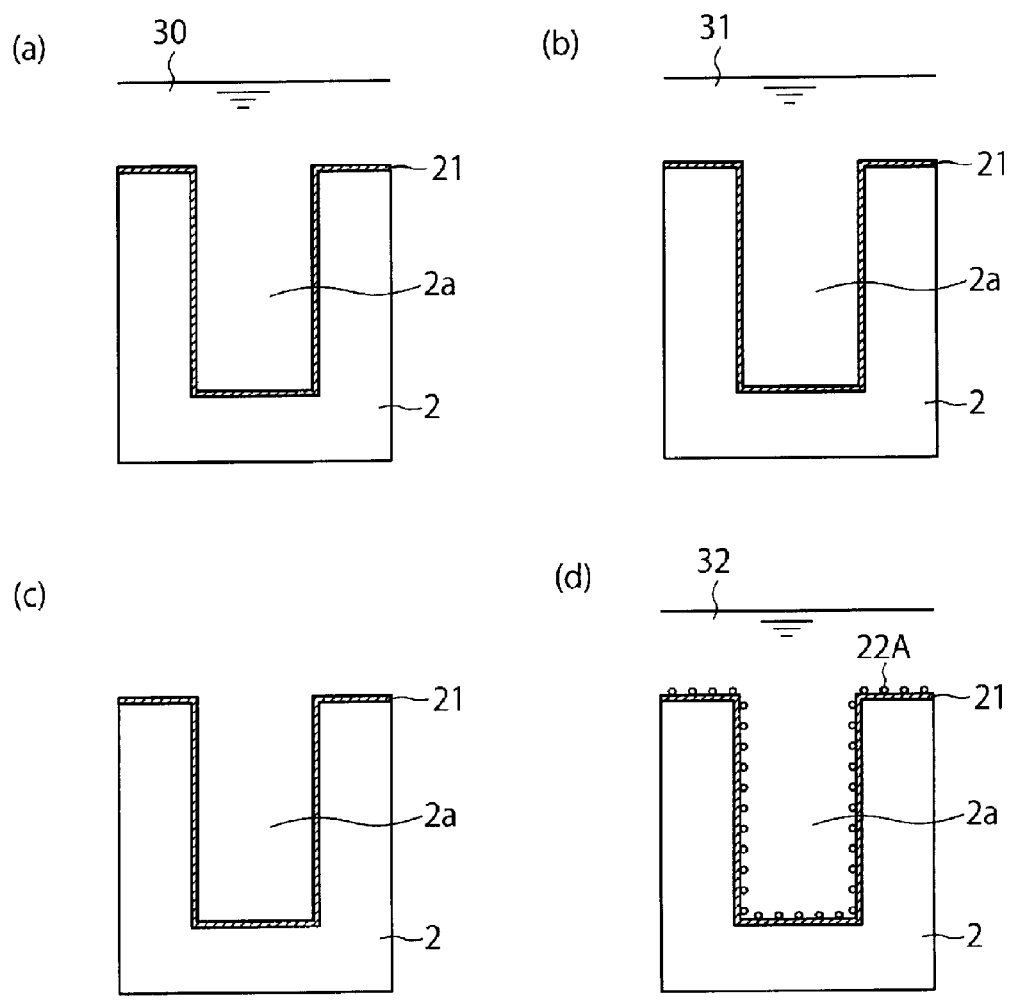
FIG. 4A provides diagrams illustrating a substrate on which the catalyst layer forming method according to the exemplary embodiment is performed.

Thereafter, as illustrated in FIG. 4A, while the substrate 2 is rotated by the substrate holding/rotating device 110, DIW (Deionized Water) as pure water is supplied onto the substrate 2 from the nozzle 92 of the nozzle head 104. In this case, the nozzle 92 of the nozzle head 104 is stopped at a position above a central portion 2A of the substrate 2. As the DIW 30 is supplied onto the substrate 2 in this state, pre-wetting with pure-water is performed on the substrate 2 (see (a) of FIG. 4A).

Subsequently, while rotating the substrate 2, IPA (Isopropyl Alcohol) 31 is supplied onto the substrate 2 from the nozzle 92 of the nozzle head 104. In this case, the nozzle 92 of the nozzle head 104 is stopped at a position above the central portion 2A of the substrate 2 (see (b) of FIG. 4A).

Afterwards, while the substrate 2 is rotated at a rotational number of 500 rpm, the supply of the IPA 31 from the nozzle 92 is stopped. Accordingly, the DIW on the entire surface of the substrate 2 and within the recess 2*a* is removed (see (c) of FIG. 4A).

Then, while keeping on rotating the substrate 2, a catalyst solution 32 containing the nano-palladium (n-Pd) serving as the catalyst 22A is supplied onto the substrate 2 from the discharge nozzle 32A of the nozzle head 104 (see (d) FIG. 4A).

In the meanwhile, the discharge nozzle 32A of the nozzle head 104 is reciprocated between the position above the central portion 2A of the substrate 2 and a position above a peripheral portion 2B of the substrate 2. In this way, by supplying the catalyst solution 32 containing the catalyst 22A from the discharge nozzle 32A of the nozzle head 104 onto the substrate 2 while rotating the substrate 2 and reciprocating the discharge nozzle 32A of the nozzle head 104 between the position above the central portion 2A of the substrate 2 and the position above the peripheral portion 2B of the substrate 2, the catalyst solution 32 is diffused onto the entire surface of the substrate 2. By supplying the catalyst solution on the entire surface of the substrate 2 in this way, the catalyst 22A can be adsorbed to the entire surface of the substrate 2 and to an inner surface of the recess 2*a*, so that the catalyst layer 22 is formed.

Then, while rotating the substrate 2, DIW 33 as a rinse liquid is supplied onto the substrate 2 again from the nozzle 92. At this time, the nozzle 92 of the nozzle head 104 is stopped at the position above the central portion 2A of the substrate 2. Accordingly, the entire surface of the substrate 2 and the inside of the recess 2*a* are cleaned (rinsed) by the DIW (rinse liquid) 33, so that impurities and residues on the entire surface of the substrate 2 and within the recess 2*a* are removed by the DIW 33 (see (e) of FIG. 4B).

Thereafter, while keeping on rotating the substrate 2, the supply of the DIW 33 from the nozzle 92 is stopped. Accordingly, a spin-drying process is performed on the entire surface of the substrate 2 and within the recess 2*a*, so that the entire surface of the substrate 2 and the inside of the recess 2*a* can be dried (see (f) of FIG. 4B).

Subsequently, while rotating the substrate 2, a binder solution 34 containing a binder such as, but not limited to, polyvinylPyrrolidone (PVP) is supplied onto the substrate 2 from the discharge nozzle 32B of the nozzle head 104 (see (g) of FIG. 4B).

In the meanwhile, the discharge nozzle 32B of the nozzle head 104 is reciprocated between the position above the central portion 2A of the substrate 2 and the position above the peripheral portion 2B of the substrate 2. In this way, by supplying the binder solution 34 containing the binder from the discharge nozzle 32B of the nozzle head 104 onto the substrate 2 while rotating the substrate 2 and, also, reciprocating the discharge nozzle 32B of the nozzle head 104 between the position above the central portion 2A of the substrate 2 and the position above the peripheral portion 2B of the substrate 2, the binder solution 34 is diffused onto the entire surface of the substrate 2.

Figure 4B:
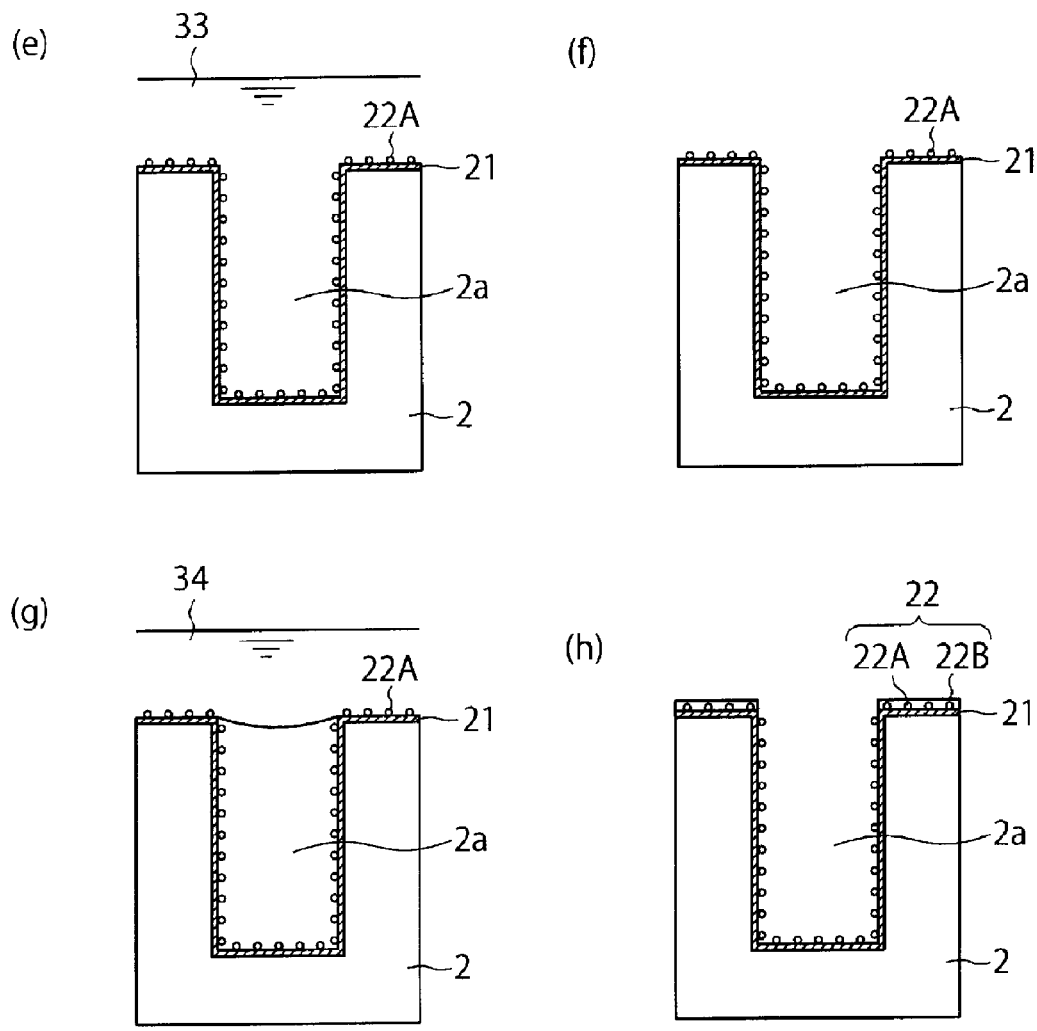
FIG. 4B provides diagrams illustrating the substrate on which the catalyst layer forming method according to the exemplary embodiment is performed.

Here, as depicted in (g) of FIG. 4B, since the recess 2*a* of the substrate 2 is dried, the binder solution 34 does not enter the recess 2*a* but just passes on and along the surface of the substrate 2.

Subsequently, while keeping on rotating the substrate 2, the supply of the binder solution 34 from the discharge nozzle 32B is stopped. Accordingly, the catalyst 22A adsorbed on the entire surface of the substrate 2 can be firmly bound to the substrate 2 by the binder 22B contained in the binder solution 34 (see (h) of FIG. 4B).

Next, the catalyst solution 32 supplied to the substrate 2 and the catalyst 22A contained in the catalyst solution 32 will be explained. First, the catalyst 22A will be elaborated.

As the catalyst 22A adsorbed onto the adhesion layer 21 of the substrate 2, a catalyst having catalysis to accelerate a plating reaction may be appropriately used. By way of example, a catalyst formed of nanoparticles may be used. Here, the nanoparticle means a colloid particle that has catalysis and has an average particle diameter equal to or smaller than 20 nm, e.g., within the range from 0.5 nm to 20 nm. An element constituting the nanoparticles may include, by way of example, but not limitation, palladium, gold, platinum, or the like. Among these, the palladium of nanoparticle may be represented as n-Pd.

Further, as the element constituting the nanoparticles, ruthenium may be used.

A method of measuring the average particle diameter of the nanoparticles is not particularly limited, and various methods may be adopted. By way of example, when measuring the average particle diameter of the nanoparticles in the catalyst solution, a dynamic light scattering method may be employed. In the dynamic light scattering method, a laser beam is irradiated to the nanoparticles dispersed in the catalyst solution, and the average particle diameter of the nanoparticles is calculated by measuring scattered light.

Further, to measure the average particle diameter of the nanoparticles adsorbed on the recess 2a of the substrate 2, a preset number of nanoparticles, for example, twenty nanoparticles may be detected from an image which is obtained by using a TEM (Transmission Electron Microscope) or a SEM (Scanning Electron Microscope), and the average particle diameter of these nanoparticles may be calculated.

Now, the catalyst solution 32 containing the catalyst 22A formed of the nanoparticles will be elaborated. The catalyst solution 32 contains ions of a metal constituting the nanoparticles serving as the catalyst 22A. For example, if palladium constitutes the nanoparticles, the catalyst solution contains a palladium compound, such as palladium chloride, as a palladium ion source.

A specific composition of the catalyst solution 32 is not particularly limited. Desirably, however, the composition of the catalyst solution 32 is set such that the catalyst solution 32 has a viscosity coefficient equal to or less than 0.01 Pa·s. By setting the viscosity coefficient of the catalyst solution 32 to be in this range, the catalyst solution can be sufficiently diffused down up to a bottom portion of the recess 2a of the substrate 2, even if a diameter of the recess 2a of the substrate 2 is small. Accordingly, the catalyst 22A can be securely adsorbed to the bottom portion of the recess 2a of the substrate 2 as well more securely.

Desirably, the catalyst 22A in the catalyst solution is coated with a dispersant. Accordingly, surface energy of the catalyst 22A can be reduced. As a result, it is assumed that the diffusion of the catalyst 22A within the catalyst solution 32 can be more accelerated, so that the catalyst 22A can reach the bottom portion of the recess 2a of the substrate 2 in a shorter time period. Furthermore, it is assumed that an increase in the diameter of the catalyst 22A caused by agglomeration of multiple catalysts 22A can be suppressed, so that the diffusion of the catalyst 22A in the catalyst solution can be further accelerated.

A method for preparing the catalyst 22A coated with the dispersant is not particularly limited. By way of example, a catalyst solution 32 containing the catalyst 22A which is previously coated with the dispersant may be supplied to the catalyst layer forming unit 13. Alternatively, the catalyst layer forming unit 13 may be configured to perform a process of coating the catalyst 22A with the dispersant within the catalyst layer forming unit 13, for example, within the catalyst solution supplying device 30A.

Specifically, it is desirable to use polyvinylPyrrolidone (PVP), polyacrylic acid (PAA), polyethyleneimine (PEI), tetramethylammonium (TMA), citric acid, or the like as the dispersant.

Besides, various chemical materials for controlling the characteristic may be added into the catalyst solution.

Furthermore, the catalyst solution 32 containing the catalyst 22A may not be limited to the catalyst solution 32 containing the nanoparticles such as n-Pd. By way of example, an aqueous solution of palladium chloride ($PdCl_2$) may be used as the catalyst solution, and Pd ions in the palladium chloride ($PdCl_2$) may be used as the catalyst 22A.

Further, the binder solution 34 supplied to the substrate 2 contains the binder 22B, and the catalyst 22A adsorbed on the substrate 2 can be firmly bound to the substrate 2 by the binder 22B. The binder solution 34 may contain polyvinylPyrrolidone (PVP) as the binder 22B.

Alternatively, the binder solution 34 may also be implemented by a water-soluble resin or the like. Still alternatively, a catalyst solution containing n-Pd as the catalyst 22A and PVP as the dispersant may be used as the binder solution 34. In this case, the PVP in the catalyst solution functions as the binder.

After the catalyst layer 22 is formed on the substrate 2 in the catalyst layer forming unit 13 as stated above, the substrate 2 is then transferred into the plating layer forming unit 14 by the substrate transfer arm 11.

Subsequently, in the plating layer forming unit 14, a plating layer 23 serving as a Cu diffusion barrier film (barrier film) is formed on the catalyst layer 22 of the substrate 2 (see FIG. 2C).

In this case, the plating layer forming unit 14 is configured as the liquid processing apparatus as illustrated in FIG. 5 and FIG. 6. The plating layer 23 can be formed by performing an electroless plating process on the catalyst layer 22 of the substrate 2.

When forming the plating layer 23 in the plating layer forming unit 14, a plating liquid containing, for example, Co—W—B may be used as the plating liquid, and a temperature of the plating liquid is maintained at 40° C. to 75° C. (desirably, 65° C.).

By supplying the plating liquid containing the Co—W—B onto the substrate 2, the plating layer 23 containing the Co—W—B is formed on the catalyst layer 22 of the substrate 2 through the electroless plating process.

Thereafter, the substrate 2 having the plating layer 23 formed on the catalyst layer 22 thereof is transferred from the plating layer forming unit 14 into the airtightly sealed casing 15a of the baking unit 15 by the substrate transfer arm 11.

Within the airtightly sealed casing 15a of the baking unit 15, the substrate 2 is heated on the hot plate 15A under an inert gas atmosphere where a $N_2$ gas is filled, in order to suppress the substrate 2 from being oxidized. Accordingly, the plating layer 23 of the substrate 2 is baked (baking process).

When baking the plating layer 23 in the baking unit 15, a baking temperature may be set to be in the range from, e.g., 150° C. to 200° C., and a baking time is set to be in the range from, e.g., 10 minutes to 30 minutes.

By baking the plating layer 23 on the substrate 2 as described above, moisture within the plating layer 23 can be removed, and, at the same time, the bond between metals within the plating layer 23 can be enhanced.

The plating layer 23 formed as described above serves as the Cu diffusion barrier layer (barrier film). The substrate 2, on which the plating layer 23 serving as the barrier film is formed, is then sent to the electroless Cu plating layer forming unit 16 by the substrate transfer arm 11.

Subsequently, in the electroless Cu plating layer forming unit 16, an electroless Cu plating layer 24 serving as a seed film for forming an electrolytic Cu plating layer 25 is formed on the plating layer 23 of the substrate 2 (see FIG. 2D).

Here, the electroless Cu plating layer forming unit 16 is configured as the liquid processing apparatus as illustrated in FIG. 5 and FIG. 6. By performing the electroless plating process on the plating layer 23 of the substrate 2, the electroless Cu plating layer 24 can be formed.

The electroless Cu plating layer 24 formed in the electroless Cu plating layer forming unit 16 serves as the seed film for forming the electrolytic Cu plating layer 25. A plating liquid used in the electroless Cu plating layer forming unit 16 may contain a copper salt as a source of copper ions, such as copper sulfate, copper nitrate, copper chloride, copper bromide, copper oxide, copper hydroxide, copper pyrophosphate, or the like. The plating liquid may further contain a reducing agent and a complexing agent for the copper ions. Further, the plating liquid may further contain various kinds of additives for improving stability or speed of the plating reaction.

The substrate 2 having the electroless Cu plating layer 24 formed thereon is sent to the electrolytic Cu plating layer forming unit 17 by the substrate transfer arm 11. Here, the substrate 2 having the electroless Cu plating layer 24 formed thereon may be sent to the electrolytic Cu plating layer forming unit 17 after sent to and baked in the baking unit 15. Subsequently, in the electrolytic Cu plating layer forming unit 17, an electrolytic Cu plating process is performed on the substrate 2, so that an electrolytic Cu plating layer 25 is filled within the recess 2a of the substrate 2 by using the electroless Cu plating layer 24 as the seed film (see FIG. 2E).

According to the exemplary embodiment, since the DIW 33 is supplied onto the substrate 2 after the catalyst solution 32 is supplied onto the substrate 2, the impurities and the residues left on the surface of the substrate 2 and within the recess 2a thereof can be removed. Thus, there may be no adverse effect upon the characteristic of the entire wiring substrate structure. Furthermore, after the catalyst 22A is adsorbed on the surface of the substrate 2 by supplying the catalyst solution 32 onto the substrate 2, the binder solution 34 is supplied onto the substrate 2. As a result, the catalyst 22A adsorbed onto the substrate 2 can be securely bound to the substrate 2 by the binder 22B. Therefore, the plating layer 23 on the catalyst layer 22 can be suppressed from being peeled off from the substrate 2.

Modification Examples of Exemplary Embodiment

Below, modification examples of the present exemplary embodiment will be described. In the above-described exemplary embodiment, after the catalyst layer 22 is formed by adsorbing the catalyst 22A onto the entire surface of the substrate 2 and onto the inner surface of the recess 2a, the rinse liquid 33 is supplied onto the substrate 2 from the nozzle 92 of the nozzle head 104, so that the impurities and the residues left on the entire surface of the substrate 2 and within the recess 2a are removed by the rinse liquid 33. Thereafter, the spin-drying process is performed on the entire surface of the substrate 2 and the inside of the recess 2a, and then, the binder is supplied onto the substrate 2. However, after the impurities and the residues left on the entire surface of the substrate 2 and within the recess 2a are removed by the rinse liquid 33, the spin-drying process on the entire surface of the substrate 2 and the inside of the recess 2a may not be performed. That is, the binder solution 34 may be supplied onto the substrate 2 in the state that the rinse liquid 33 is still filled within the recess 2a of the substrate 2.

In such a case, since the binder solution 34 passes on and along the surface of the substrate 2, the binder solution 34 does not enter the recess 2a of the substrate 2.

Furthermore, in the above-described exemplary embodiment, after the binder solution 34 is supplied onto the substrate 2 and the catalyst 22A adsorbed on the surface of the substrate 2 is firmly bound to the substrate 2 by the binder 22B contained in the binder solution 34, the spin-drying process is performed on the substrate 2 while rotating the substrate 2. However, after the binder solution 34 is supplied onto the substrate 2, the substrate 2 may be sent from the catalyst layer forming unit 13 into the baking unit 15 by the substrate transfer arm 11, and the substrate 2 may be baked by the baking unit 15 (baking process).

In such a case, by baking the substrate 2 in the baking unit 15, the moisture in the binder 22B on the substrate 2 is removed and the binder 22B is baked. As a result, the catalyst 22A can be more firmly bound to the substrate 2.

Then, the substrate 2 baked by the baking unit 15 may be sent to the plating layer forming unit 14 and the plating layer 23 may be formed by the plating layer forming unit 14. Further, the substrate 2 baked by the baking unit 15 may be returned back into the catalyst layer forming unit 13 and multilayers of the binder 22B may be formed on the catalyst layer 22A by supplying the binder solution 34 onto the substrate 2 again within the catalyst layer forming unit 13.

Moreover, in case of baking the binder 22B by baking the substrate 2 in the baking unit 15, the baking unit 15 constitutes a part of the catalyst layer forming system.

In addition, the above exemplary embodiment has been described for the case where the electrolytic Cu plating layer is obtained through the electrolytic Cu plating process. However, the exemplary embodiment is not limited thereto, and the Cu plating layer may be formed by performing the electroless Cu plating process instead of the electrolytic Cu plating process.

Moreover, in the above-described exemplary embodiment, to bake the plating layer 23 or the catalyst layer 22, the substrate 2 is heated on the hot plate 15A within the airtightly sealed casing 15a of the baking unit 15 under the inert gas atmosphere where the $N_2$ gas is filled. However, the exemplary embodiment is not limited thereto. By way of example, to reduce a processing temperature or to shorten a processing time, the substrate 2 may be heated on the hot plate 15A while depressurizing the airtightly sealed casing 15a to the vacuum level.

In addition, the above exemplary embodiment has been described for the case where the plating layer 23 or the catalyst layer 22 is baked in the baking unit 15. However, a heating source such as a lamp irradiating unit 200 (UV light or the like) arranged above the substrate 2 or a hot plate (not shown) covering the substrate 2 may be provided within the catalyst layer forming unit 13 or the plating layer forming unit 14 shown in FIG. 5. In this configuration, the catalyst layer 22 may be baked within the catalyst layer forming unit 13 or the plating layer forming unit 14.

INDUSTRIAL APPLICABILITY

The exemplary embodiment is applicable to the semiconductor device, and, particularly, to the multilayer wiring technology.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A catalyst layer forming method of forming a catalyst layer on a substrate, comprising:
   preparing the substrate having a recess;
   forming a catalyst layer by supplying a catalyst solution containing a catalyst onto the substrate to adsorb the catalyst onto a surface of the substrate and onto an inner surface of the recess;
   rinsing the surface of the substrate and an inside of the recess by supplying a rinse liquid onto the substrate;
   drying the surface of the substrate and the inside of the recess; and
   binding the catalyst on the surface of the substrate to the surface of the substrate by supplying a binder solution containing a binder onto the substrate while rotating the substrate such that the binder solution does not enter into the dried recess but passes on and along the surface of the substrate.

2. The catalyst layer forming method of claim 1, wherein the substrate is dried after the binder solution is supplied onto the substrate.

3. The catalyst layer forming method of claim 1, wherein the substrate is baked after the binder solution is supplied onto the substrate.

4. The catalyst layer forming method of claim 3, wherein the binder solution containing the binder is supplied onto the substrate again after the substrate is baked.

5. The catalyst layer forming method of claim 1, wherein the binder solution contains polyvinylPyrrolidone (PVP) as the binder.

6. The catalyst layer forming method of claim 1, wherein the catalyst solution contains n-Pd or palladium chloride as the catalyst.

7. The catalyst layer forming method of claim 1, wherein the catalyst solution further contains a dispersant.

8. The catalyst layer forming method of claim 7, wherein the catalyst solution contains polyvinylPyrrolidone (PVP) as the dispersant.

9. A catalyst layer forming system of forming a catalyst layer on a substrate, comprising:
   a substrate holding/rotating device configured to hold and rotate the substrate having a recess;
   a catalyst solution supply unit configured to supply a catalyst solution containing a catalyst onto the substrate to form the catalyst layer by adsorbing the catalyst onto a surface of the substrate and onto an inner surface of the recess;
   a rinse liquid supply unit configured to supply a rinse liquid to rinse the surface of the substrate and an inside of the recess;
   a substrate drying unit configured to dry the surface of the substrate and the inside of the recess; and
   a binder solution supply unit configured to supply a binder solution containing a binder onto the substrate to bind the catalyst on the surface of the substrate to the surface of the substrate while rotating the substrate such that the binder solution does not enter into the dried recess but passes on and along the surface of the substrate.

10. A catalyst layer forming system of forming a catalyst layer on a substrate, comprising:
    a substrate holding/rotating device configured to hold and rotate the substrate having a recess;
    a catalyst solution supply unit configured to supply a catalyst solution containing a catalyst onto the substrate to form the catalyst layer by adsorbing the catalyst onto a surface of the substrate and onto an inner surface of the recess;
    a rinse liquid supply unit configured to supply a rinse liquid to rinse the surface of the substrate and an inside of the recess; and
    a binder solution supply unit configured to, in a state that the rinse liquid is filled within the recess, supply a binder solution containing a binder onto the substrate to bind the catalyst on the surface of the substrate to the surface of the substrate such that the binder solution does not enter into the recess.

11. The catalyst layer forming system of claim 9, wherein the substrate holding/rotating device serves as the substrate drying unit.

12. The catalyst layer forming system of claim 9, further comprising:
    a baking unit configured to bake the substrate after the binder solution is supplied onto the substrate.

13. A non-transitory computer-readable recording medium having stored thereon computer-executable instructions that, in response to execution, cause a catalyst layer forming system to perform a catalyst layer forming method, wherein the catalyst layer forming method comprises:
    preparing the substrate having a recess;
    forming a catalyst layer by supplying a catalyst solution containing a catalyst onto the substrate to absorb the catalyst onto a surface of the substrate and onto an inner surface of the recess;
    rinsing the surface of the substrate and an inside of the recess by supplying a rinse liquid onto the substrate;
    drying the surface of the substrate and the inside of the recess; and
    binding the catalyst on the surface of the substrate to the surface of the substrate by supplying a binder solution containing a binder onto the substrate while rotating the substrate such that the binder solution does not enter into the dried recess but passes on and along the surface of the substrate.

* * * * *